US006707874B2

(12) United States Patent
Murphy

(10) Patent No.: US 6,707,874 B2
(45) Date of Patent: Mar. 16, 2004

(54) MULTIPLE-OUTPUT COUNTERS FOR ANALOG-TO-DIGITAL AND DIGITAL-TO-ANALOG CONVERSION

(76) Inventor: Charles Douglas Murphy, 1816 W. Wilson Ave. #3, Chicago, IL (US) 60640

(*) Notice: Subject to any disclaimer, the term of this patent is extended or adjusted under 35 U.S.C. 154(b) by 0 days.

(21) Appl. No.: 10/122,654

(22) Filed: Apr. 15, 2002

(65) Prior Publication Data

US 2003/0194047 A1 Oct. 16, 2003

(51) Int. Cl.[7] .................................................. H03K 21/00
(52) U.S. Cl. ............................... 377/33; 377/34; 377/35; 377/36; 377/56
(58) Field of Search ........................... 377/33, 34, 35, 377/36, 56

(56) References Cited

U.S. PATENT DOCUMENTS

| | | |
|---|---|---|
| 3,982,107 A | 9/1976 | Butler |
| 3,992,611 A | 11/1976 | Henry |
| 4,016,558 A | 4/1977 | Bishop et al. |
| 4,021,646 A | 5/1977 | Meier |
| 4,075,464 A | 2/1978 | Davies, Jr. |
| 4,105,979 A | 8/1978 | Kage |
| 4,109,208 A | 8/1978 | Tomisawa et al. |
| 4,134,106 A | 1/1979 | Hungerford |
| 4,140,897 A | 2/1979 | Guerra |
| 4,169,380 A | 10/1979 | Mansfield et al. |
| 4,197,450 A | 4/1980 | Oren et al. |
| 4,205,303 A | 5/1980 | Barnhart |
| 4,214,173 A | 7/1980 | Popper |
| 4,229,646 A | 10/1980 | Burkhardt et al. |
| 4,266,215 A | 5/1981 | Adams |
| 4,328,484 A | 5/1982 | Denecke |
| 4,360,742 A | 11/1982 | Freyman |
| 4,389,637 A | 6/1983 | Rzeszewski |
| 4,414,678 A | 11/1983 | Baumgartner |
| 4,467,319 A | 8/1984 | Uchikoshi |
| 4,486,851 A | 12/1984 | Christopher et al. |
| 4,504,741 A | 3/1985 | Armitage |
| 4,509,183 A | 4/1985 | Wright |
| 4,566,110 A | 1/1986 | Kolber |
| 4,587,665 A | 5/1986 | Minakuchi |
| 4,611,337 A | 9/1986 | Evans |
| 4,646,060 A | 2/1987 | Phillips et al. |
| 4,685,614 A | 8/1987 | Levine |
| 4,724,421 A | 2/1988 | Simison et al. |
| 4,845,728 A | 7/1989 | Truong et al. |
| 4,891,827 A | 1/1990 | Slater |
| 4,906,875 A | 3/1990 | Cutler |
| 4,961,014 A | 10/1990 | Kasahara |
| 4,990,796 A | 2/1991 | Olson |
| 5,033,069 A | 7/1991 | Lin et al. |
| 5,066,927 A | 11/1991 | Dent |
| 5,157,701 A | 10/1992 | Parker |
| 5,159,696 A | 10/1992 | Hartnett |
| 5,206,890 A | 4/1993 | Fujita |
| 5,237,597 A | 8/1993 | Yang et al. |
| 5,339,079 A | 8/1994 | Ledzius et al. |
| 5,404,386 A | 4/1995 | McCollough et al. |
| 5,559,844 A | 9/1996 | Lee |
| 5,708,453 A | 1/1998 | Tsuchida et al. |
| 5,842,006 A | 11/1998 | Harvey et al. |
| 5,940,467 A | 8/1999 | Fransson |
| 6,064,712 A | 5/2000 | Diamondstein et al. |
| 6,072,849 A | 6/2000 | Sessions |

OTHER PUBLICATIONS

U.S. patent application Ser. No. 10/084,803, Murphy, filed Feb. 28, 2002.

Primary Examiner—Margaret R. Wambach

(57) ABSTRACT

A machine used for digital counting which can provide multiple output counts. The machine is particularly useful in analog-to-digital (A/D) converters and in digital-to-analog (D/A) converters. The multiple output counts can change in different directions or in the same direction, and are generated using shared circuitry. The invention exploits properties of counting systems to allow A/D and D/A conversions in convenient digital number formats or in multiple different formats. The invention can be used in integrating converters to help eliminate errors such as comparator offset and dielectric absorption while converting and to increase the conversion rate.

34 Claims, 3 Drawing Sheets

FIG. 1

| INTEGER | SIGN-MAGNITUDE | OFFSET BINARY | TWO'S COMPLEMENT |
|---|---|---|---|
| +7 | 0111 | 1111 | 0111 |
| +6 | 0110 | 1110 | 0110 |
| +5 | 0101 | 1101 | 0101 |
| +4 | 0100 | 1100 | 0100 |
| +3 | 0011 | 1011 | 0011 |
| +2 | 0010 | 1010 | 0010 |
| +1 | 0001 | 1001 | 0001 |
| 0 | 0000 | 1000 | 0000 |
| −1 | 1001 | 0111 | 1111 |
| −2 | 1010 | 0110 | 1110 |
| −3 | 1011 | 0101 | 1101 |
| −4 | 1100 | 0100 | 1100 |
| −5 | 1101 | 0011 | 1011 |
| −6 | 1110 | 0010 | 1010 |
| −7 | 1111 | 0001 | 1001 |
| −8 | — | 0000 | 1000 |
| (−0) | 1000 | — | — |

MULTIPLE-OUTPUT COUNTERS FOR ANALOG-TO-DIGITAL AND DIGITAL-TO-ANALOG CONVERSION

CROSS-REFERENCE TO RELATED APPLICATIONS

The invention is related to SHARED PARALLEL DIGITAL-TO-ANALOG CONVERSION submitted as a separate application to the US PTO by Charles D. Murphy and having application Ser. No. 10/084,803 and filing date Feb. 28, 2002. The invention is also related to OFFSET-COMPENSATED SHARED PARALLEL ANALOG-TO-DIGITAL CONVERSION submitted as a separate application to the US PTO by Charles D. Murphy.

STATEMENT REGARDING FEDERALLY SPONSORED RESEARCH OR DEVELOPMENT

Not applicable

REFERENCE TO A MICROFICHE APPENDIX

Not applicable

BACKGROUND

1. Field of Invention

The invention relates to digital counting in different number systems, particularly for analog-to-digital and for digital-to-analog converters with circuitry shared among multiple parallel conversion operations or among differing conversion structures.

2. Description of Prior Art

Digital counters are ubiquitous in both digital and mixed-signal electronics. For example, digital counters are used to track elapsed time in analog-to-digital (A/D) converters in which a comparator indicates when a time-varying difference between an unknown input signal and a deterministic reference signal reaches zero. Similarly, a digital counter may be used in a digital-to-analog (D/A) converter, such as those of the US PTO application SHARED PARALLEL DIGITAL-TO-ANALOG CONVERSION. In that application, multiple digital numbers to be converted to analog signals are compared to a shared running count. When each digital number matches the count, a reference analog signal is sampled and held.

Prior art A/D converters and D/A converters which use counters often use counting systems such as signed magnitude or offset binary. These are convenient because it is easy to make suitable counters with these systems, and also because there is a natural connection between these systems and the base-2 logarithmic decompositions (in the case of A/D conversion) or compositions (in the case of D/A conversion) of analog signals. However, much digital calculation uses two's complement number systems, which offer easy arithmetic operations including addition, subtraction, negation, and multiplication.

In a typical A/D converter, one counter is used for one conversion operation. The counter is reset when a second conversion is carried out. Usually, the technique or structure of the first conversion operation is identical to the technique or structure of the second conversion operation, with a waveform and a corresponding count sequence that are the same. However, there are a few prior art examples of parallel AID converters in which a counter is used simultaneously for multiple conversions. In these examples, the non-shared circuitry for the various conversion operations is usually identical, and the shared circuitry serves an identical purpose in each of the parallel conversions.

A disadvantage of existing techniques for A/D and D/A conversion are that number systems which are well-suited to converter architectures may not be the same number systems that are used for other digital computation. It may be necessary to include extra circuitry or programming instructions devoted to translating between the number formats. Moreover, in A/D and D/A converters where counters are shared elements of parallel conversion operations, non-shared circuitry is usually of identical construction, which may limit the cost savings of sharing.

SUMMARY

The present invention is a technique for using a single counting circuit to provide a variety of different count sequences, which eliminates the need for special translation circuitry between A/D or D/A converters and other digital computation circuitry and which reduces the cost of implementing parallel and shared parallel converters.

OBJECTS AND OBJECTIVES

There are several objects and objectives of the present invention.

It is an object of the present invention to provide a simple counter which can count in a desired number system such as sign-magnitude, offset binary, or two's complement.

It is another object of the present invention to provide a simple counter which can count up or down in a desired number system such as sign-magnitude, offset binary, or two's complement.

It is still another object of the present invention to provide a simple counter which can count up and down simultaneously in a desired number system such as sign-magnitude, offset binary, or two's complement.

It is a further object of the present invention to provide a simple counter which can count in multiple desired number systems such as sign-magnitude, offset binary, and two's complement.

It is another object of the present invention to provide a counter which can be used as either a shared or a non-shared component in A/D converters which may operate in parallel.

It is another object of the present invention to provide a counter which can be used as either a shared or a non-shared component in D/A converters which may be operating in parallel.

It is another object of the present invention to provide an A/D converter which can produce outputs in multiple digital number formats.

It is another object of the present invention to provide a D/A converter which can accept inputs in multiple digital number formats.

Further objects and advantages of the invention will become apparent from a consideration of the ensuing description.

DRAWING FIGURES

In the drawings, closely related figures have the same number but different alphabetic suffixes.

FIG. 1 shows a table of 4-bit signed integers in three systems of representation similar to that in "The Art of Electronics", second edition on page 477.

REFERENCE NUMERALS IN DRAWINGS

Figure 2A:
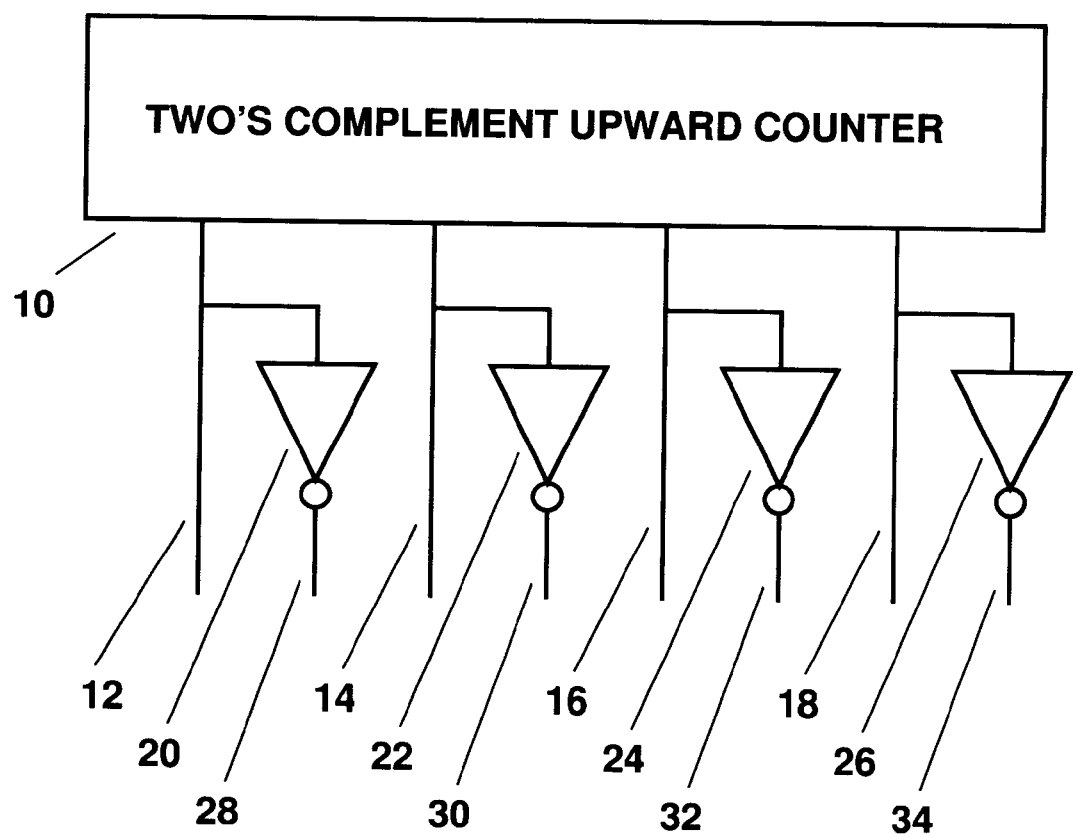
FIG. 2A shows a preferred embodiment of the invention with simultaneous counting up and counting down in four-bit two's complement.

- 10 a two's complement upward counter
- 12 a first output
- 14 a second output
- 16 a third output
- 18 a fourth output
- 20 a first inverter
- 22 a second inverter
- 24 a third inverter
- 26 a fourth inverter
- 28 a first inverted output
- 30 a second inverted output
- 32 a third inverted output
- 34 a fourth inverted output
- 36 a natural binary counter
- 38 a fifth output
- 40 a fifth inverted output

DESCRIPTION—COUNTERS

Counters are a basic building block of digital computers. A popular prior art counter is the ripple counter. In a ripple counter, a transition of a digital clock signal triggers a change of state of a least-significant representation element, which can usually take on two possible values. The least-significant representation element is sometimes known as the least-significant bit (LSB). A change in the state of the LSB may trigger a change in the state of an adjacent bit. In turn, a change in the state of this adjacent bit may trigger a change in the state of another adjacent bit. This process continues until a most-significant bit (MSB) in the counter is reached.

Usually, each state transition is triggered by either a rising edge or by a falling edge. The LSB state change may be triggered by a rising clock edge going from a digital "low" value (i.e. 0) to a digital "high" value (i.e. 1). The first adjacent bit changes state when the LSB changes from a 1 to a 0. Similarly, the MSB changes state when the bit immediately adjacent to it changes from a 1 to a 0. The ripple counter gets its name from the fact that transitions in the LSB pass or "ripple" through successively more-significant bits until the MSB is reached. Starting from an initial state of all bits being 0, an N-bit ripple counter reaches a state of all bits being 1, resulting in a count sequence known as unsigned binary. Usually, the count is considered to be a count up from the starting value and its representation, with increments between count sequence members of one LSB unit.

Because the final state of each bit during one clock cycle depends on the final state of all bits of lower significance, the ripple counter may be slow to settle. This limits the rate at which the ripple counter counts, particularly for large N. An alternative to the ripple counter involves "look-ahead".

In a look-ahead counter, a bit's change of state is governed directly by the states and state changes of more than one bit of lower significance. For instance, the second adjacent bit, which depends on transitions of the LSB and on transitions the bit adjacent to the LSB, could be triggered when the digital clock edge rises and the LSB and adjacent bit are both already equal to 1. In a full look-ahead counter, which is also known as a synchronous counter, each bit including the MSB could be triggered to change states when all bits of lower significance are equal to 1 and the digital clock presents a rising edge.

The major advantage of look-ahead counting is that the settling speed is reduced. For a full look-ahead counter, the settling time of the overall count is approximately the same as the settling time of the LSB. The major disadvantage of look-ahead counting is the need for additional circuitry to do the looking ahead. A full look-ahead adder, which has the smallest settling time, also has the largest amount of additional circuitry. Half look-ahead, or other limited look-ahead adders, have intermediate settling time and amounts of additional circuitry.

Look-ahead counters are similar to look-ahead adders, which are common in digital circuit design. However, as a counter typically changes by one LSB unit with each increment, a look-ahead counter can have much less circuitry for the look-ahead operation than a look-ahead adder.

DESCRIPTION—NUMBER FORMATS

The prior art counters discussed above lend themselves quite naturally to unsigned integer counting. A typical N-bit unsigned integer format maps the N-bit string 0 . . . 0 to the value 0, the N-bit string 0 . . . 01 to the value 1, the N-bit string 0 . . . 010 to the value 2, the N-bit string 0 . . . 011 to the value 3, and so on up to the N-bit string 1 . . . 1, which corresponds to the value $2^N-1$.

Unsigned binary integer formats represent one way to count numbers. However, they are incapable of representing negative numbers. One possible way to represent negative numbers is simply to change the mapping between the bit strings and number values. For instance, one can subtract $2^{N-1}$ from each of the values of the N-bit unsigned binary integer format to obtain N-bit offset binary. In this format, the N-bit string 0 . . . 0 corresponds to the value $-2^{N-1}$, the N-bit string 0 . . . 01 to the value $2-2^{N-1}$, the N-bit string 10 . . . 0 to the value 0, the N-bit string 10 . . . 01 to the value 1, and so on up to the N-bit string 1 . . . 1, which corresponds to the value $2^{N-1}-1$.

As discussed on page 476 of the second edition of THE ART OF ELECTRONICS by Paul Horowitz and Winfield Hill, offset binary formats are "popular in A/D and D/A conversions," but are "awkward for computation". The reason for offset binary's use in A/D and D/A converters is that "the number sequence from the most negative to the most positive is a simple binary progression, which makes it a natural for binary 'counters'."

With respect to specifics of the use of offset binary formats in A/D and in D/A converters, pages 612–641 of THE ART OF ELECTRONICS discuss various techniques for both types of converters. In some D/A converters, digital number inputs cause currents to be switched into output lines or generated in a resistive network tied to a summing junction. For these converters, the simple binary progression allows easy addition of binary-weighted currents. In other D/A converters, such as pulse-width modulation converters, there is actually a counter that counts clock pulses using an offset binary format. Likewise, some A/D converters produce outputs based on a set of comparator outputs provided as inputs to decoding logic, while other A/D converters use a counter to measure elapsed time.

Another number format that is sometimes used in A/D converters is sign magnitude. In binary sign magnitude formats, one bit is designated to be a sign bit. If the number is positive, this bit has a value of 1. If the number is negative, this bit has a value of 0. The remaining bits are an unsigned integer representation of the magnitude of the number. Thus, the binary strings representing +5 and −5 differ only in their sign bit, because the number values have the same magnitude.

An advantage of binary sign magnitude formats is that they closely parallel the decimal counting system that most people use for counting. From a computational perspective, useful features of binary sign magnitude formats are that negation—i.e. multiplication by minus one—can be implemented by flipping or complementing the sign bit, while scaling by powers of two can be implemented via wholesale shifting of the magnitude bits. Disadvantages of sign magnitude formats include the existence of two representations of zero and the fact that addition and subtraction operations require separate procedures. A subtraction cannot be implemented as addition of the negative of a number.

The dominant signed integer representation is two's complement. According to p. 477 of the second edition of "The Art of Electronics" by Paul Horowitz and Winfield Hill:

In this system, positive numbers are represented as simple unsigned binary. The system is rigged up so that a negative number is then simply represented as the binary number you add to a positive number of the same magnitude to get zero. To form a negative number, first complement each of the bits of the positive number (i.e., write 1 for 0, and vice versa; this is called the "1's complement"), then add 1 (that's the "2's complement").

In two's complement representations, addition, subtraction, and multiplication operations work the same way regardless of the signs of the numbers, which is not the case for signed magnitude representations. The all-zero string represents the number value zero.

Referring again to computation, two's complement representations have a simple means for negation, namely bit flipping followed by addition of the two's complement representation for the number one. Also, multiplication by powers of two can be implemented via shifting of groups of bits.

In addition to integer representations, there are floating point number representations in which some bits represent an exponent value and some bits represent a mantissa value. The mantissa and exponent taken separately may be represented in two's complement, as unsigned integers, or in another representation. Possible low-cost operations include negation and subtraction and multiplication of mantissa by mantissa or of exponent by exponent.

FIG. 1 shows a table of 4-bit signed integers in three systems of representation copied from page 477 of "The Art of Electronics". The representations shown in the figure are mapped to integer values between −8 and +7 inclusive. Features worth noting are that the two's complement and offset binary representations of the same integer are identical except for a complemented sign bit. Also, two's complement representations of non-negative integers are the same as sign-magnitude representations of those integers.

While the number systems in the table of FIG. 1 define a specific mapping of integer number values to 4-bit binary strings, it is entirely possible to have a different integer value map or a non-integer value map based on scaling of the values by a common non-zero scaling factor. The scaling factor could be positive, or it could be negative. With a negative scaling factor, the interpretation of 1 and 0 values in both sign and non-sign bits would be reversed. With a non-integer scaling factor, one or more of the representations would correspond to non-integer number values.

Changing the mapping between number values and binary strings by non-zero scaling defines new format types which may or may not include only signed integers. However, inasmuch as the properties of the various representations do not change, the ensuing descriptions and claims are intended to include scaled signed integer representations.

DESCRIPTION—THE PREFERRED EMBODIMENT OF THE INVENTION

The preferred embodiment of the invention is a machine used for digital counting which can provide a first output count in a first finite-precision numeric format and which can also provide a second output count in a second finite-precision numeric format. In the preferred embodiment, the first finite-precision numeric format and the second finite-precision numeric format are the same format. Thus the first count output and the second count output are in the same format.

In the preferred embodiment of the invention, the second output count is generated using substantially the same circuitry that is used to generate the first output count. Since the circuitry is largely shared, the cost of generating the two output counts may be much less than the cost of having one counter circuit which generates the first output count and a second separate counter circuit which generates the second output count.

FIG. 2A shows an implementation of the preferred embodiment of the invention for generating a first output count which forms an increasing sequence of 4-bit two's complement number representations. The shared circuitry in FIG. 2A is a two's complement upward counter 10 having a first output 12, a second output 14, a third output 16, and a fourth output 18 corresponding respectively to the MSB through the LSB of a first output count. First output 12 is passed as an input to first inverter 20, which produces first inverted output 28. Second output 14 is passed as an input to second inverter 22 which produces second inverted output 30. Third output 16 is passed as an input to third invert 24 which produces third inverted output 32. Last, and least, fourth output 16 is passed as an input to fourth inverter 26 which produces fourth inverted output 34.

In FIG. 2A, first output 12, second output 14, third output 16, and fourth output 18 together form a first output count. First inverted output 28, second inverted output 30, third inverted output 32, and fourth inverted output 34 together form a second output count. Both the first output count and the second output count are in 4-bit two's complement representations. Two's complement upward counter 10 provides a first output count sequence that increases. According to the table in FIG. 1, then, the value of the second output count in FIG. 2A is always equal to the negative of the value of the first output count, minus one.

DESCRIPTION—ALTERNATIVE EMBODIMENTS

Because the two's complement number representations in the table of FIG. 1 differ from their offset binary counterparts only in the sign bit, two's complement upward counter 10 can be made from a 4-bit natural upward binary counter with the sign bit inverted. A natural upward binary counter produces the increasing sequence used to represent increasing magnitudes in the sign magnitude format of FIG. 1 and to represent the distance from negative eight in the offset binary format of FIG. 1. In other words, the circuitry of 4-bit two's complement upward counter 10 might be implemented as a prior art natural upward binary counter with an inverter before the sign bit output. Of course, it may be possible to implement a two's complement upward counter with an alternative circuit.

Figure 2B:
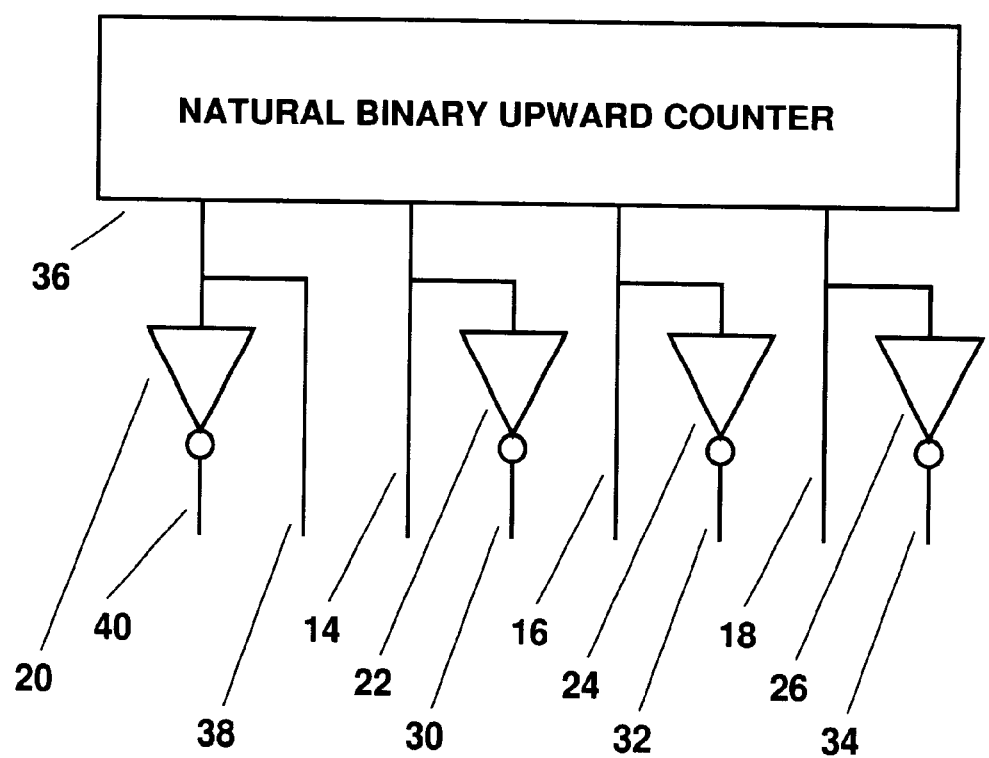
FIG. 2B shows an alternative embodiment of the invention with simultaneous counting up and counting down in four-bit two's complement using a natural 4-bit binary counter.

In an alternative to the circuit of FIG. 2A, a multi-output counter producing increasing and decreasing two's complement counts can be implemented according to FIG. 2B. In FIG. 2B, a natural binary upward counter 36, which might be a prior art ripple counter, a prior art synchronous counter, or even an adder, provides four outputs, which are a fifth output 40, a second output 14, a third output 16, and a fourth output 18. Second output 14, third output 16, and fourth output 18 are identical to their counterparts in FIG. 2A, and are likewise passed respectively to a second inverter 22 which produces a second inverted output 30, to a third inverter 24 which produces a third inverted output 32, and to a fourth inverter 26 which produces a fourth inverted output 28.

Natural binary upward counter 36 also produces fifth output 38, which is the sign bit. Fifth output 38 is passed to a first inverter 20 which produces a fifth inverted output 40. Thus, the first output count which in FIG. 2A consisted of first output 12, second output 14, third output 16, and fourth output 18 in FIG. 2B consists of fifth inverted output 40, second output 14, third output 16, and fourth output 18. Similarly, the second output count which in FIG. 2A consisted of first inverted output 28, second inverted output 30, third inverted output 32, and fourth inverted output 34 in FIG. 2B consists of fifth output 38, second inverted output 30, third inverted output 32, and fourth inverted output 34.

Allowing for finite settling time and logic signal rise or fall times, at some point during each clock cycle, the first output count in FIG. 2B is always equal to the negative of the second output count, less one. If it is desired that the first output count and the second output count be negatives of each other, one need only include circuitry which adds one to the LSB and which adds any overflow to bits of successively higher significance. Such "add one" circuitry can be implemented quite easily as an extra set of components operating on bits in the representation of the second output count, with lower cost than a general adder circuit. Alternatively, natural binary upward counter 36 can include memory, with the counter itself used to add one and the results stored and provided as output with suitable delay. In still another alternative, "subtract one" circuitry can be implemented and applied to the bits in the representation of the first output count.

In still another alternative embodiment, the multiple counts can be generated using shared circuitry, but increment in the same direction, up or down. The numbers can, for instance, be separated by a constant offset. For example, considering the two's complement representations in the table of FIG. 1A, note that the two least-significant bits corresponding to the value of −8 are identical to the two least-significant bits of −4. Similarly, the two least-significant bits corresponding to the value −7 are identical to those of the representation of −3, while the two least-significant bits corresponding to the value −6 are identical to those of the representation of −2, and so on.

Circuit components used to keep track of the two least-significant bits of a first count beginning at −8 and increasing by +1 at each moment can produce outputs that are also used as the two least-significant bits of a second count beginning at −4 when the first count is at −8 and always staying displaced by 4 count locations from the first count. In other words, the second count begins at −4 and increases by +1 when the first count increases by +1. Note that the counting is assumed to wrap around when the maximum or minimum represented values are reached, so that, still referring to the two's complement representations in the table of FIG. 1 the representation of −6 is displaced by +4 units from the representation of +6, the representation of −5 is displaced by +7 units from +7, and the representation of −4 is displaced by +4 units from −8.

Continuing the example given just above, note that the sign bit of the representation of −8 is the same as the sign bit of the representation of −4, but that the sign bit of the representation of −3 is not the same as the sign bit of the representation of +1. Thus, separate circuitry may be required to keep track of the sign bit of the first count and the sign bit of the second count.

The preferred embodiment and the example given just above demonstrate, respectively, that counts changing in opposite directions and counts with a constant offset can be generated using shared circuitry. It should be noted that a combination of the techniques used in the example could be used to generate counts with desired initial offsets and subsequent time-varying offsets. For instance, one might count up by unit counts from −8 simultaneous with counting down by unit counts from −4.

DESCRIPTION—MORE ALTERNATIVE EMBODIMENTS

In another alternative embodiment, a multi-output counter can provide a first output count and a second output count, but does not do so simultaneously. For instance, referring again to FIG. 2A, switching circuitry might be included to select the bit lines corresponding to the first output count or the bit lines corresponding to the second output count. In complementary metal oxide semiconductor (CMOS) circuit implementations, power is consumed when logic circuits change state. If the second output count is not desired, the inverters in FIG. 2A could be disabled, reducing the dynamic power consumption in a CMOS implementation. Of course, this would require additional switching circuitry.

In another alternative embodiment with multiple outputs not provided simultaneously, the first output count could have a different finite-precision numeric format than the second output count. For instance, the first output count could be in a 10-bit two's complement format, while the second output count could be in a 4-bit two's complement format. Again, logic circuits that are not needed could be disabled or powered down, resulting in reduced power consumption for some types of implementation technologies.

As another example, the first output count could be in a two's complement format, while the second output count could be in a sign magnitude format. Thus, two output counts in different format types could be provided. Recalling that some prior art A/D converters use sign magnitude formats, that some prior art A/D and D/A converters use offset binary formats, and that most other digital logic computations use two's complement formats, a counter which can count in multiple systems would be a useful replacement for multiple separate counters each of which can count in only one number system.

Such a counter could be used for easy translation between number systems in A/D or in D/A conversion. For instance, in a shared D/A converter where a digital input number is compared to a sequence of reference numbers, with a corresponding analog reference signal sampled and held to generate an analog output, a counter with a first output count in a two's complement format and a second output count in an offset binary format would be useful. The first output count could be digitally compared to the digital input number in two's complement, while the second output count could be used to govern a current-switched analog reference source. The multi-format counter could be used in parallel conversion, with multiple digital input numbers converted to multiple analog output signals.

In addition to acting as a counter, the circuit of FIG. 2A might be used as a format translator. Many counters include means for initializing the count value. By initializing a count value in natural binary upward counter 36, one can immediately obtain the corresponding representation in two's complement from the first output count, or minus one plus the negative of the corresponding representation in two's complement.

In still another alternative embodiment, a counter with outputs in multiple formats can be used for simultaneous D/A conversion from digital numbers in multiple formats or for simultaneous A/D conversion to digital numbers in multiple formats.

Particularly useful formats for alternative embodiments of the invention include sign magnitude formats, offset binary formats, and two's complement formats. Alternative embodiments of the invention can provide output counts in differing format types, such as sign magnitude and offset binary, sign magnitude and two's complement, and offset binary and two's complement. Alternative embodiments can also provide output counts in similar format types, such as two's complement formats of differing precisions.

A particularly useful component for generating one output count from another output count is the inverter, which flips or complements a binary representation element value. For instance, if an inverter input is 1, the inverter output is 0, while if the inverter input is 0, the inverter output is 1. Other logic circuits can be set up to emulate inverters.

DESCRIPTION—INTEGRATING A/D CONVERTERS

Some alternative embodiments of the invention are particularly useful in A/D converters based on integration. Integrating A/D converters use a controlled change in an analog signal with a simultaneous controlled change in the stage of a digital counter. A comparator having analog inputs and a digital output is used to trigger acquisition of a digital number value from the counter.

The controlled change in the analog signal is often provided by a known current source or sink which charges or discharges a capacitor. For instance, in single slope integration, a voltage proportional to an analog input signal to be converted to a digital output number is applied to one input of a comparator. A voltage ramp is applied to the other input. The voltage ramp comprises a constant current source charging a capacitor. A digital counter is incremented while the voltage ramp is generated. When the voltage ramp reaches the level of the voltage proportional to the analog input signal, the comparator output changes state and triggers disabling of the counter. The final value of the count is the digital output number.

Practically, there are a number of problems with the idealized approach of single-slope integration. A major problem, particularly in high-precision applications, is the existence of a comparator input offset voltage. In principle, the comparator output changes state when the two comparator inputs are equal. However, the comparator output actually changes state when the two comparator inputs differ by a small voltage known as the input offset voltage. The input offset voltage consists of a fixed offset which results from manufacturing variations in the comparator and a time-varying offset which depends on temperature. The offset voltage causes an error in the recorded digital output number.

A second problem is dielectric absorption in the integrating capacitor. Dielectric absorption results from a non-ideal insulating dielectric material between the capacitors conducting plates. The insulator is not a perfect insulator, and can be modeled as a series resistor and capacitor in parallel with the actual capacitor. When the voltage across the actual capacitor is changed, the time constant of the series circuit elements result in a lag of the actual voltage relative to the ideal voltage. The length of the delay and the magnitude and polarity of the dielectric absorption depend on the magnitude, polarity, and recent history of the current which is driving the voltage change. As with the comparator offset, the effect of dielectric absorption is an error in the digital output number.

The error caused by a comparator's input offset voltage can be reduced or eliminated by calibrating the comparator when it is used. For instance, one can include a reference conversion just before or just after conversion of an unknown analog input signal. The reference requires a known analog value and a corresponding desired digital number value. Removing the desired digital number value from the measured digital number value provides a digital error count which can be used to correct the value of the digital output number corresponding to the unknown analog input. If the reference conversion occurs in close temporal proximity to the conversion of the unknown analog input signal, it may be presumed that the temperature is approximately the same during the two conversions, and thus that the comparator offset voltage is the same.

In some integrating A/D converters, the effect of dielectric absorption is treated as imparting a constant delay during a single voltage ramp. This assumption is valid for a small enough time constant of the dielectric absorption relative to the slope and duration of the voltage ramp. Typically, the capacitor is discharged for several time constants, then charged with a constant current to create the voltage ramp. The advantage of this approach is that the reference conversion used for calibration above will also correct the error due to dielectric absorption in this case. The disadvantages of the approach are that the capacitor can only be used infrequently due to the time required for sufficient settling of the voltage due to dielectric effect, and that with a single voltage ramp, otherwise useful stored charge is simply discarded.

Another way to reduce the effects of comparator offset and capacitor stability—but not of dielectric absorption—is to make proportional measurements using the same capacitor and comparator. For instance, in dual-slope integration, a capacitor is first charged for a fixed time count by a current which is proportional to an analog input signal to be converted to a digital output number. This results in a charge on the capacitor which is proportional to the analog input signal, but unknown. In a second portion of the conversion, the capacitor is discharged using a known, constant current source. A time count required for complete discharge is measured as the digital output number.

In dual-slope integration, the error due to comparator offset can be reduced by beginning the fixed-time integration when the comparator output changes, which results in a voltage across the capacitor equal to the offset voltage and a voltage proportional to the input current. Then on the discharge cycle, the count is stopped at a voltage equal to the offset voltage, and the offset-induced error is decreased. Similarly, having an imprecise capacitor value is compensated by charging and discharging using the same capacitor.

Note, however, that the dielectric absorption effect is not eliminated in dual-slope integration. The capacitor is charged with one current for a fixed period of time in the first part of the conversion, and discharged with a different current for a different period of time during the second part of the conversion. There is no delay between charging and discharging.

DESCRIPTION—ALTERNATIVE EMBODIMENTS OF THE INVENTION FOR INTEGRATING A/D CONVERTERS

Some A/D conversion techniques allow elimination of both errors due to comparator input offset voltages and dielectric absorption. In particular, some of these techniques use a capacitor that is charged with a constant current and discharged with a second constant current of opposite polarity, resulting in a triangle wave.

During a first rise or fall cycle of the triangle wave, a first time count required for the reference signal to reach a voltage proportional to an analog input signal is measured. The first time count includes the desired count plus a first error due to comparator offset and a second error due to dielectric absorption. During a second cycle in the opposite direction from the first cycle, the comparator inputs are switched, and a second time count is measured. The second time count includes the desired count minus the first error due to comparator offset and the second error due to dielectric absorption. From the first cycle to the second cycle, the first error changes polarity because the comparator inputs are switched. From the first cycle to the second cycle, the second error changes polarity because the driving current changes polarity.

By adding the first time count to the second time count, one can obtain a sum equal to twice the desired count. By subtracting the second time count from the first time count, one can obtain a difference equal to twice the sum of the first error and the second error. One possibility is to implement every conversion as the sum of measurements from a rise cycle and a fall cycle. Another alternative embodiment has a combination of the error terms measured and used to correct multiple conversions. With the error measurements in hand, a full conversion can take place on each rise cycle and on each fall cycle, and does not require switching of both comparator inputs.

With respect to the triangle-wave A/D converter described above, the multi-output counter of the present invention can be used in several ways. Consider a measurement made on a rise cycle, with a comparator triggering recording of a first time count when the rising portion of the triangle wave reaches the analog input signal level. Let the counter begin at a given first initial count and increase to a first final count during the rise cycle. The measured first time count includes the desired count and the error counts described above, with an offset depending on the given first initial count. Next, consider a measurement made on the subsequent fall cycle of the triangle wave, with the comparator inputs switched. Let the counter begin at the first final count and decrease to the given first initial count. The comparator output changes state and triggers recording of a second time count when the downward count reaches the desired count less the error counts described above. If, on the other hand, the comparator were to begin at the first initial count and increase to the first final count, the recorded second count would have to be subtracted from the first final count to obtain the second time count.

In an alternative embodiment of the present invention, a first upward count can be provided for the rising cycle of the triangle wave, while a second downward count can be provided for the falling cycle of the triangle wave. This saves the additional subtraction operation that would be required when counting in the same direction for both rise and fall cycles. The upward count and the downward count can be in the same finite-precision numeric format and can share the same counter circuitry, obviating the need for separate upward and downward counters. Note that a counter which can add one or which can subtract one could likewise be used in place of two separate counters, but that the circuitry required for such a counter may well be more costly to implement than that of embodiments the present invention.

In still another alternative embodiment of the invention, the addition operation suggested above for error correction can be eliminated by measuring the total error count and choosing a first initial count value which offsets the count in the opposite direction. Then the measured first time count can have a value which is, directly, the desired count. The two's complement and offset binary systems wrap around. For instance, referring to the 4-bit systems of the table in FIG. 1, one added to +7 results in −8 in both systems, while one subtracted from −8 results in +7 in both systems. Suppose an error correction count of −1 is required. Rather than beginning the upward count at −8, the upward count could begin at +7, with an increasing count going through +6. On reaching +6, which is a final count of +7−1, the other count can be ready for counting from −7, to −8, to +7, and so on down. Thus, it may not be necessary to initialize the error-correcting offset count prior to each up or down cycle.

In still another alternative embodiment of the present invention, a multi-output counter may be a shared component in a multiplicity of parallel A/D converters. For instance, two triangle-wave A/D converters may operate in parallel, but with a half-period delay in their triangle waveforms. In other words, while the triangle wave of one converter is rising, the triangle wave of the other converter is falling. An alternative embodiment of the present invention could simultaneously provide an upward count to one converter and a downward count to the other converter.

The relative waveform delay might be useful in canceling parasitic effects of large voltage swings. Also, the triangle-wave converters might be implemented using switched-capacitor or other discrete charge transfer techniques rather than using a constant current charging a single capacitor. Charge could be alternately transferred to and from a pair of capacitors, resulting in the pair of triangle waves. This might result in a reduction in the power consumption of the converters, as stored charge would not simply be wasted by shorting storage capacitors to ground.

In an alternative embodiment of the present invention useful for offset compensation in shared parallel A/D conversion, successive count representations covering the maximum range of deviation due to comparator offset and dielectric absorption can be stored. In other words, if the maximum deviation is plus or minus 5 count increments, a range of 11 successive count values could be stored. An error correction count could be computed for each of a multiplicity of comparators with separate or shared integrating capacitors, and different count table members could be selected when comparators trigger count recording simultaneously but have differing error correction terms.

DESCRIPTION—ALTERNATIVE EMBODIMENTS OF THE INVENTION FOR D/A CONVERSION

One technique for D/A conversion suggested in SHARED PARALLEL DIGITAL-TO-ANALOG CONVERSION is to have a digital reference count incremented simultaneously with an analog reference signal. A digital comparator determines when the digital reference count matches an input digital number, and triggers recording of the analog reference signal at that time. A multiplicity of digital comparators with a corresponding multiplicity of sample-and-hold circuits can share the same counter.

The present invention provides multiple digital counts. In an alternative embodiment of the invention, a first output count and a second output count can be in differing formats. Applied to D/A conversion, digital numbers in differing finite-precision numeric formats can be converted by selecting an output count in an appropriate format to pass as input to a digital comparator along with each digital number.

In another alternative embodiment, a multiplicity of digital numbers in a multiplicity of different finite-precision numeric formats can be converted simultaneously, with a multi-output counter as a shared component. Inputs in one finite-precision numeric format can be digitally compared to a first output count in that finite-precision numeric format, while inputs in a second finite-precision numeric format can be digitally compared to a second output count in the second finite-precision numeric format. For instance, digital numbers representative of CD-quality sound signals could be converted to analog values simultaneously with conversion of digital numbers representative of MPEG video signals.

In another alternative embodiment, the multi-output counter could be used to provide digital counts corresponding to a multiplicity of analog reference signals. For instance, a counter which provides simultaneous upward and downward counts could be digitally compared to a digital input number of a D/A converter while a pair of analog reference signals respectively increasing and decreasing are generated. The analog reference signals could span the minimum analog output to half of the maximum analog output and the maximum output to half of the minimum output respectively. Associated with each ramp would be a digital comparator. When one of the digital comparators detects that the digital input number is equal to the input count to that digital comparator, sampling-and-holding of the corresponding ramp signal could be triggered.

Note that in the alternative embodiment just above, a digital comparator does not suffer from comparator offset, so there is no need for offset error correction. The advantage of the alternative embodiment suggested is a speed-up of the D/A conversion by a factor of two.

In an alternative embodiment of the invention, a multiplicity of analog reference signals and a multiplicity of digital counts could be used for simultaneous parallel shared D/A conversion. For instance, a first triangle waveform as described earlier for A/D conversion and a second triangle waveform delayed by a half a period relative to the first could be used simultaneously. Associated with each at any given time could be one of two counts from a multi-output counter. For instance, an increasing first output count could be associated with a rising portion and a decreasing second output count could be associated with a falling portion.

During one D/A conversion, a digital input number could be digitally compared to a first output count increasing from a minimum count value to a half-way count value, which count is associated with a first analog signal rising from a minimum analog value to a half-way analog value. Simultaneously, the digital input number could be digitally compared to a second output count decreasing from a maximum count value to the half-way count value, the second count being associated with a second analog signal falling from a maximum analog value to the half-way analog value. The digital input number could be converted to an analog output level in one half of the rise or fall time.

During a second D/A conversion, a second digital input number could be digitally compared to the first output count increasing from the half-way count value to the maximum count value, the first output count being associated with the first analog signal's rising from the half-way analog value to the maximum analog value. Simultaneously, the second digital input number could be digitally compared to the second output count decreasing from the half-way count value to the minimum count, the second count being associated with the second analog signal's falling from the half-way analog value to the minimum analog value.

In the alternative embodiment described above, one counter provides both an increasing count and a decreasing count each of which is associated with rising cycles or with falling cycles of triangle waves. The result is that during one half-period of the triangle waves, two D/A conversions can be performed. One could readily have for a positive integer N, a multiplicity of 2 times N simultaneous counts, 2 times N triangle waves with relative delays which are multiples of one divided by the quantity 2 times N, and 2 times N digital comparators, with 2 times N conversions performed per triangle wave half-period.

In another alternative embodiment, one D/A conversion could be performed using a series of simultaneous analog signals that all increase or that all decrease. These could be, for instance, a set of delayed sawtooth waves, or a set of delayed triangle waves. A multi-output counter could provide more than one output count used in one conversion, or more than one output count each used in a different conversions.

For instance, 8 counters each providing an upward count and a downward count could be used for two simultaneous conversions. With each of the 8 counters having wrap-around upward count outputs delayed by ⅛ of a full count range relative to other counters' outputs, and 8 increasing analog ramp segments each delayed by ⅛ of a full ramp period relative to the other increasing ramp segments, the 8 upward count outputs could be used to perform one or more D/A conversions in each ⅛ of a full ramp period. Simultaneously, with each of the 8 counters having wrap-around downward count outputs delayed by ⅛ of the full count range relative to other counters' outputs, and 8 decreasing analog ramp segments each delayed by ⅛ of a full ramp period relative to the other decreasing ramp segments, the 8 downward count outputs could be used to perform one or more D/A conversions in each ⅛ of a full ramp period.

By increasing the number of available output counts and the number of available reference ramps, it is possible to drastically reduce the conversion time. Further through-put increases are possible if each set of counters and corresponding waveforms is available to multiple parallel conversion operations. Implementation cost reductions are possible using embodiments of the present invention. Implementation cost reductions are also possible using parallel waveforms and counters that are identical in structure. Note, however, that the minimum conversion time may have a lower limit due to the non-zero acquisition time of sample-and-hold circuits used to acquire the analog output signal levels.

DESCRIPTION—FURTHER NOTES REGARDING DIELECTRIC ABSORPTION

If there is an analog error due to dielectric absorption in a capacitor used in producing voltage ramps which form triangle or saw-tooth waves to be used in D/A conversion, various alternative embodiments of the invention can be used to digitally correct the analog error. For instance, a multi-output counter could be initialized with a measured offset correction derived from a calibration technique, such as one or more reference digital number values converted to one or more desired reference analog output values. This is similar to one of the correction techniques proposed for A/D conversion. Another technique similar to one proposed for A/D conversion above would be to store a number of successive counts, with each digital comparator comparing the input number to an offset count selected from the table depending on the measured characteristics of the corresponding analog reference signal generator.

Also note that while the effects of dielectric absorption may be modeled as a constant delay in an analog waveform, the delay is not in fact constant. Particularly for the proposed triangle waveforms, the delay undergoes a strongly nonlinear transition near peaks and troughs when the driving current changes polarity. Whereas the ideal triangle wave has sharp peaks and troughs, the actual triangle wave influenced by dielectric absorption effects has rounded peaks and troughs. It is suggested that the valid analog conversion range for both A/D and D/A conversion be restricted to signal levels relatively far from the transition regions. Then the nonlinear nature of the dielectric absorption effects in these regions can be largely ignored.

DESCRIPTION—FURTHER NOTES REGARDING NUMBER SYSTEMS

In the earlier discussion of number systems, and particularly with reference to the table in FIG. 1, counting systems were presented as having an ordered list of number representations, each of which corresponded to a number value. The most important features of number systems are the number representations and their order. This is because the counter itself is designed according to particular rules for changing from one representation to another in a particular direction, and is independent of the exact number values assigned to each representation. For instance, one could add a small non-zero term to each number value in the table of FIG. 1 to obtain "new" finite-precision numeric formats, without actually changing the rules for counting and arithmetic operations on the number representations.

A useful feature of some counter implementations is that an increase or decrease can be made modulo the size of the set of representations. This results in upward counts that roll over to the lowest representation in the order of representations, and in downward counts that roll over to the highest representation in the order of representations.

Finally, it is not intended that the present invention cover multiple output counts which are generated only by taking subsets of representation element values from a first output count as the representation element values for a second output count. An example of this would be an 8-bit two's complement count which is just the 8 most-significant bits of a 16-bit two's complement count. Some operation which has the possibility of changing a representation element value must be used, such as, for binary representation elements, complementing bits, selectively complementing bits, or changing the order of bits (e.g. the bit-reversing used in some fast Fourier transform implementations).

CONCLUSION, RAMIFICATIONS, AND SCOPE

The reader will see that the present invention has several advantages over prior art techniques for both analog-to-digital (A/D) conversion and digital-to-analog (D/A) conversion. One counter can be used to provide both an upward count and a downward count using shared circuitry. The counts can be used for one or more conversion operations performed simultaneously.

In alternative embodiments, counts in multiple formats can be provided, so that A/D and D/A converters can accommodate digital numbers in a variety of different finite-precision numeric formats. Different formats can include different counting systems. Different outputs can also have differing numbers of bits of precision.

Embodiments of the present invention can be implemented using simple digital logic applied to prior art techniques for digital counting. Alternative embodiments can be used with counter initialization for correcting errors due to comparator input offset voltages. Still other embodiments can be used to correct errors due to both comparator input offset voltages and capacitor dielectric absorption effects. Error terms in both A/D conversion and in D/A conversion can be corrected. Low-cost error correction in massively parallel conversions with shared counters are possible.

The description above contains many specific details relating to A/D conversion, D/A conversion, counting systems, relative count values, finite-precision numeric formats, representation elements, implementation technologies, measurement error sources, waveforms, calibration techniques, capacitors, dielectric absorption models, and comparators. These should not be construed as limiting the scope of the present invention, but as illustrating some of the presently preferred embodiments of the invention. The scope of the invention should be determined by the appended claims and their legal equivalents, rather than by the examples given.

I claim:

1. A machine used for digital counting in data conversion, comprising:
   a. a first output count
      i. said first output count being provided in a first finite-precision numeric format having more than one bit of precision
      ii. said first output count being a first data conversion digital reference signal
   b. a second output count which is not identical to said first output count
      i. said second output count being provided in a second finite-precision numeric format having more than one bit of precision
      ii. said second output count being a second data conversion digital reference signal
   c. shared means for generating said first output count and said second output count whereby said machine for digital counting can provide two different output counts generated using shared components rather than entirely separate compones, and whereby said machine for digital counting can provide said two different output counts as data conversion digital reference signals for analog-to-digital data conversion, for digital-to-analog data conversion, or for both analog-to-digital and digital-to-analog data conversion.

2. The machine of claim 1 in which:
   a. said first output count changes in a first direction from the direction set consisting of increasing or decreasing
   b. said second output count changes in a second direction from said direction set
   c. said second direction is not the same as said first direction whereby said first output count increases and said second output count decreases, or whereby said first output count decreases and said second output count increases.

3. The machine of claim 1 in which:
   a. said first output count changes in a first direction from the direction set consisting of increasing or decreasing
   b. said second output count changes in a second direction from said direction set
   c. said second direction is the same as said first direction whereby said first output count and said second output count both increase, or whereby said first output count and said second output count both decrease.

4. The machine of claim 1 further including means for switching between providing said first output count and providing said second output count, whereby said machine provides two different counts, but does not do so simultaneously.

5. The machine of claim 1 further including means for providing said first output count and said second output count simultaneously.

6. The machine of claim 1 in which said first finite-precision numeric format is the same format as said second finite-precision numeric format.

7. The machine of claim 6 in which said first finite-precision numeric format is a first format from a format set consisting of two's complement formats and offset binary formats.

8. The machine of claim 7 further including means for complementing the sign bit of a representation of a value of said first output count to obtain the sign bit of the representation of a corresponding value of said second output count.

9. The machine of claim 7 further including means for complementing a multiplicity of non-sign bits of a representation of a value of said first output count to obtain a multiplicity of non-sign bits of the representation of a corresponding value of said second output count.

10. The machine of claim 6 in which said first finite-precision numeric format is a sign magnitude format.

11. The machine of claim 10 further including means for complementing the sign bit of a representation of a value of said first output count to obtain the sign bit for the representation of a corresponding value of said second output count.

12. The machine of claim 11 further including means for complementing a multiplicity of magnitude bits of a representation of a value of said first count to obtain a multiplicity of magnitude bits for the representation of the corresponding value of said second output count.

13. The machine of claim 1 in which said first finite-precision numeric format is not the same finite-precision numeric format as said second finite-precision numeric format, whereby said machine for digital counting can provide output counts in different finite-precision numeric formats.

14. The machine of claim 13 in which:
   a. said first finite-precision numeric format is a member of a first format set from the set of format sets consisting of the set of offset binary formats and the set of two's complement formats
   b. said second finite-precision numeric format is a member of a second format set from said set of format sets
   c. said second format set is not the same set as said first format set whereby said machine for digital counting can provide one output count in an offset binary format and one count in a two's complement format.

15. The machine of claim 14 further including means for complementing the sign bit of a representation of a value of said first output count to obtain the sign bit of the representation of a corresponding value of said second output count.

16. The machine of claim 13 in which:
   a. said first finite-precision numeric format is a member of a first format set from the set of format sets consisting of the set of sign magnitude formats and the set of two's complement and offset binary formats
   b. said second finite-precision numeric format is a member of a second format set from said set of format sets
   c. said second format set is not the same set as said first format set whereby said machine for digital counting can provide one output count in an sign magnitude format and one count in a two's complement format or in an offset binary format.

17. The machine of claim 16 in which said first finite-precision numeric format is a member of a two-member format set consisting of a sign-magnitude format and an offset binary format and in which said second finite-precision numeric format is the other member of said two-member set, further including:
   a. means for determining the state of a sign bit in a first representation of a first value of said first output count
   b. means for complementing said sign bit in said first representation
   c. means for complementing non-sign bits in said first representation elements depending on said state
   d. means for adding, depending on said state, a bit value of one to a least-significant bit which is a member of the set of complemented non-sign bits, with overflow at the most significant non-sign bit discarded rather than carried over to said sign bit whereby a representation of said second output count is produced from a representation of said first output count, and whereby a number representation in a sign-magnitude format can be converted to a corresponding representation in an offset binary format, or whereby a number representation in an offset binary format can be converted to a corresponding representation in a sign-magnitude format.

18. The machine of claim 16 in which said first finite-precision numeric format is a member of a two-member format set consisting of a sign-magnitude format and a two's complement format and in which said second finite-precision numeric format is the other member of said two-member set, further including:
   a. means for determining the state of a sign bit in a first representation of a first value of said first output count
   b. means for complementing non-sign bits in said first representation depending on said state
   c. means for adding, depending on said state, a bit value of one to a least-significant bit which is a member of the set of complemented non-sign bits, with overflow at the most significant non-sign bit discarded rather than carried over to said sign bit whereby a representation of said second output count is produced from a representation of said first output count, and whereby a number representation in a sign-magnitude format can be converted to a corresponding representation in a two's complement format, or whereby a number representation in a two's complement format can be converted to a corresponding representation in a sign-magnitude format.

19. The machine of claim 1 further including an inverter.

20. The machine of claim 1 further including means for initializing said first output count to a constant value, whereby said first output count can be reset to a single desired initial value.

21. The machine of claim 1 further including means for initializing said first output count to a variable value, whereby different desired initial values can be used for said first output count.

22. The machine of claim 1 further including:
   a. means for storing representations of two or more count values of said first output count
   b. means for selecting one or more of the stored representations to provide as output whereby results of counting are not discarded immediately, so that representations of count values plus or minus correction terms are available without additional arithmetic operations beyond those implemented for the counting itself.

23. The machine of claim 1 further including means for using said first output count, said second output count, or both said first output count and said second output count for a first digital-to-analog conversion.

24. The machine of claim 23 further including:
   a. a multiplicity of analog reference signals generated in parallel
   b. a multiplicity of output counts corresponding to said multiplicity of analog reference signals, said multiplicity of output counts comprising said first output count, said second output count, or both said first output count and said second output count
   c. means for comparing a first digital input number to said multiplicity of output counts and for producing a first digital number equality signal
   d. means for acquiring a first analog output signal on receiving said first digital number equality signal, said first analog output signal having a level equal to the analog reference signal to which a member of said multiplicity of output counts corresponds, said member being indicated by said first digital number equality signal whereby said first output count and said second output count may correspond to differing analog reference signals in a digital-to-analog converter in which parallel digital comparisons and analog reference signals enable faster conversion that would be possible with a single analog reference signal such as a single switched analog reference source or a single analog ramp.

25. The machine of claim 23 further including:
   a. an analog triangle wave signal
   b. a digital comparator
   c. means for providing said first output count and a first digital number as inputs to said digital comparator during a first rising portion of said triangle wave
   d. means for using the output of said digital comparator during said first rising portion of said triangle wave to trigger recording of a first analog output value
   e. means for providing said second output count and a second digital number as inputs to said digital comparator during a first falling portion of said triangle wave
   f. means for using the output of said digital comparator during said first falling portion of said triangle wave to trigger recording of a second analog output value whereby said first digital number is converted to said first analog output value and whereby said second digital number is converted to said second analog output value, and whereby generation of said first output count and said second output count do not require separate counters.

26. The machine of claim 23 further including means for using said first output count, said second output count, or both said first output count and said second output count for a second digital-to-analog conversion which occurs in parallel with said first digital-to-analog conversion.

27. The machine of claim 26 further including:
   a. a first analog triangle wave signal
   b. a second analog triangle wave signal
   c. a first digital comparator
   d. a second digital comparator
   e. means for providing said first output count and a first digital number as inputs to said first digital comparator during a first rising portion of said first triangle wave
   f. means for using the output of said first digital comparator during said first rising portion of said first triangle wave to trigger recording of a first analog output value
   g. means for providing said second output count and a second digital number as inputs to said second digital comparator during a first falling portion of said second triangle wave
   h. means for using the output of said second digital comparator during said first falling portion of said second triangle wave to trigger recording of a second analog output value whereby said first digital number can be converted to said first analog output value and whereby said second digital number can be converted to said second analog output value simultaneously, with generation of said first output count and said second output count not requiring separate counters.

28. The machine of claim 23 in which said first finite-precision numeric format is not the same as said second finite-precision numeric format, further including:
   a. an analog reference signal
   b. a first digital number
   c. a first digital comparator having as a first input said first digital number
   d. means for selecting said first output count or said second output count to provide as a second input to said first digital comparator
   e. means for using the output of said digital comparator to trigger recording of a first analog output value whereby digital-to-analog conversion of said first digital number to said first analog output value can accommodate said first digital input number being in said first finite-precision numeric format or in said second finite-precision numeric format, for instance, said first digital input number being in a two's complement format or in an offset binary format.

29. The machine of claim 23 further including means for using said first output count, said second output count, or both said first output count and said second output count for circuit error compensation in a first digital-to-analog conversion.

30. The machine of claim 1 further including means for using said first output count, said second output count, or both said first output count and said second output count for a first analog-to-digital conversion.

31. The machine of claim 30 further including means for using said first output count, said second output count, or both said first output count and said second output count for circuit error compensation in said first analog-to-digital conversion.

32. The machine of claim 31 further including:

a. means for recording a first count value representative in a first manner of an analog input signal level and also of a circuit error signal b. means for recording a second count value representative in a second manner of said analog input signal level and of said circuit error signal c. means for operating on said first count value and said second count value using an arithmetic operation from the set consisting of addition and subtraction to produce a third count value whereby said third count value can be representative of said circuit error signal or representative of said analog input signal level, depending on the circuit structure and the arithmetic operation used, whereby circuit error signals such as the dielectric effect in a capacitor or the comparator offset signal of a comparator can be corrected.

33. The machine of claim 31 further including:

a. means for recording a first count value representative in a first manner of an analog input signal level and also of a circuit error signal b. means for determining a circuit error signal c. means operating on said first count value to produce a second count value using an arithmetic operation from the set consisting of addition and subtraction whereby said second count value is representative of said analog input signal level, whereby circuit error signals such as the dielectric effect in a capacitor or the comparator offset signal of a comparator can be corrected.

34. The machine of claim 31 further including means for using said first output count, said second output count, or both said first output count and said second output count for circuit error compensation in a second analog-to-digital conversion, whereby circuit error signals such as the dielectric effects in a multiplicity of capacitors and the comparator offset signals of a multiplicity of comparators can be corrected using a single multiple-output counter.

* * * * *